United States Patent
Vilner

(10) Patent No.: US 9,231,548 B2
(45) Date of Patent: Jan. 5, 2016

(54) PACKAGE WITH PRINTED FILTERS

(71) Applicant: Marvell Israel (M.I.S.L) Ltd., Yokneam (IL)

(72) Inventor: Pavel Vilner, Nesher (IL)

(73) Assignee: Marvell Israel (M.I.S.L) Ltd., Yokneam (IL)

(*) Notice: Subject to any disclaimer, the term of this patent is extended or adjusted under 35 U.S.C. 154(b) by 339 days.

(21) Appl. No.: 13/847,931

(22) Filed: Mar. 20, 2013

(65) Prior Publication Data

US 2013/0249656 A1  Sep. 26, 2013

Related U.S. Application Data

(60) Provisional application No. 61/614,772, filed on Mar. 23, 2012.

(51) Int. Cl.
| | |
|---|---|
| H03H 7/01 | (2006.01) |
| H01L 23/66 | (2006.01) |
| H05K 1/02 | (2006.01) |
| H05K 1/16 | (2006.01) |

(52) U.S. Cl.
CPC ............. *H03H 7/1741* (2013.01); *H01L 23/66* (2013.01); *H05K 1/025* (2013.01); *H05K 1/165* (2013.01); *H01L 2224/16225* (2013.01); *H01L 2924/15174* (2013.01); *H01L 2924/15311* (2013.01); *H05K 1/0242* (2013.01); *H05K 1/0243* (2013.01); *H05K 1/162* (2013.01)

(58) Field of Classification Search
CPC ...... H03H 7/1741; H01L 23/66; H05K 1/165; H05K 1/0243
USPC ......................................... 333/24 C, 202, 204
See application file for complete search history.

(56) References Cited

U.S. PATENT DOCUMENTS

| | | | | |
|---|---|---|---|---|
| 6,408,340 | B1* | 6/2002 | Janssen et al. ................. | 709/248 |
| 8,098,602 | B2* | 1/2012 | Wu et al. ........................ | 370/280 |
| 8,410,874 | B2* | 4/2013 | Song et al. ..................... | 333/247 |
| 2005/0077984 | A1* | 4/2005 | Lee et al. ....................... | 333/204 |
| 2011/0038286 | A1* | 2/2011 | Ta et al. ......................... | 370/295 |

* cited by examiner

*Primary Examiner* — Dean Takaoka
*Assistant Examiner* — Alan Wong

(57) ABSTRACT

Aspects of the disclosure provide a circuit package. The circuit package includes a first signal terminal electrically coupled with a serializer/deserializer (SERDES), a second signal terminal electrically coupled with an external electronic component, and a trace disposed on an insulating layer. The trace is configured to transfer an electrical signal between the first signal terminal and the second signal terminal. The trace is patterned to provide a specific filtering characteristic to filter the electrical signal.

15 Claims, 4 Drawing Sheets

PACKAGE WITH PRINTED FILTERS

INCORPORATION BY REFERENCE

This present disclosure claims the benefit of U.S. Provisional Application No. 61/614,772, "Serdes Package Bandwidth Using Printed Filters" filed on Mar. 23, 2012, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, an integrated circuit (IC) chip is assembled in a chip package, such as a dual in-line package (DIP), a pin grid array (PGA) package, a ball grid array (BGA) package, and the like. The chip package can be mounted onto a printed circuit board (PCB). The chip package and the PCB include various coupling elements, such as solder bumps, metal wires, solder balls, and the like to couple the IC chip with other devices on the PCB. The coupling elements may need to transfer data signals at a high speed between the IC chip and other devices on the PCB. The signal integrity of the data signals can be negatively affected by the coupling elements.

SUMMARY

Aspects of the disclosure provide a circuit package. The circuit package includes a first signal terminal electrically coupled with a serializer/deserializer (SERDES), a second signal terminal electrically coupled with an external electronic component, and a trace disposed on an insulating layer. The trace is configured to transfer an electrical signal between the first signal terminal and the second signal terminal. The trace is patterned to provide a specific filtering characteristic to filter the electrical signal.

According to an aspect of the disclosure, the trace is patterned to have a low pass filter characteristic at a specific cutoff frequency. In an example, the cutoff frequency is about a half of a Baud rate of the SERDES.

In an embodiment, the trace includes an inductive portion patterned to have an inductive characteristic. For example, the inductive portion is patterned to form a spiral inductor. In another embodiment, the trace includes a capacitive portion patterned to have a capacitive characteristic. For example, the capacitive portion is patterned to form a finger capacitor.

Aspects of the disclosure provide a method. The method includes receiving an electrical signal for transmission between a serializer/deserializer (SERDES) on an IC chip and an external electronic component, and transferring the electrical signal between a first signal terminal and a second signal terminal over a trace disposed on an insulating layer. The first signal terminal is electrically coupled with the SERDES and the second signal terminal is electrically coupled with the external electronic component. Further, the method includes filtering the electrical signal by the trace that is patterned to provide a specific filtering characteristic to filter the electrical signal.

Aspects of the disclosure provide a package substrate. The package substrate includes an insulating layer and a trace disposed on the insulating layer. The trace is configured to transfer an electrical signal between a first coupling element coupled to an serializer/deserializer (SERDES) and a second coupling element coupled to another device. The trace is patterned to provide a specific filtering characteristic to filter the electrical signal.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
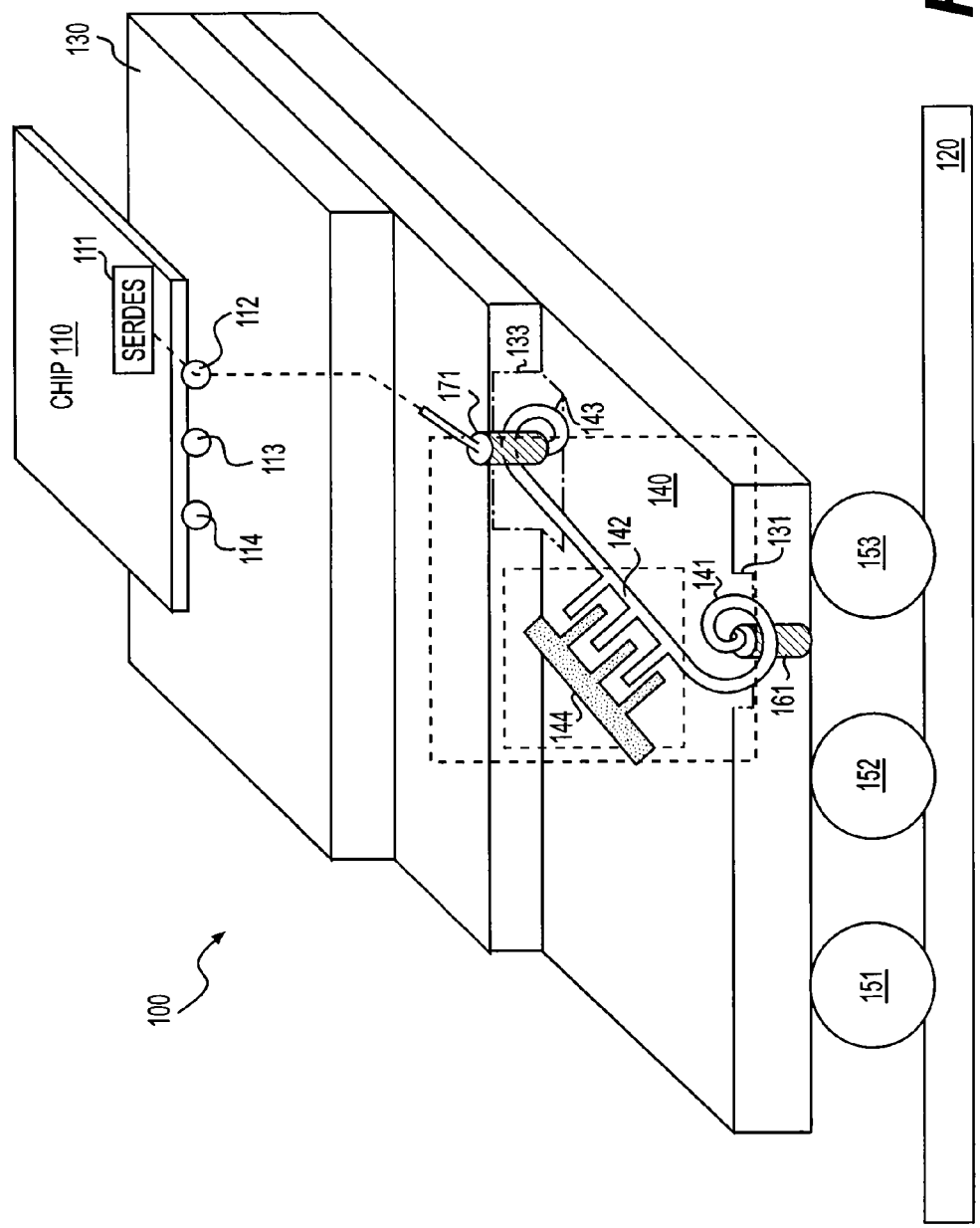
FIG. 1 shows a simplified pictorial diagram of an integrated circuit (IC) package example 100 according to an embodiment of the disclosure.

FIG. 1 shows a diagram of an integrated circuit (IC) package example 100 according to an embodiment of the disclosure. The IC package 100 includes a package substrate 130 and an IC chip 110 assembled on the package substrate 130 within the IC package 100. The IC package 100 can be mounted on a printed circuit board (PCB) 120. The IC package 100 includes various coupling elements, such as solder bumps, metal wires, vias, solder balls, and the like, that electrically couple circuits on the IC chip 110 to other devices (not shown) on the PCB 120. The coupling elements are configured, in an embodiment, to include various filter components that respectively provide a specific filtering characteristic to improve signal integrity. In an embodiment, at least some of the coupling elements, such as metal wires, are patterned so as to form filter components as an inherent part of the coupling element thereby obviating the need to add discreet filter components.

The IC chip 110 includes various circuits for signal processing. In an example, the IC chip 110 includes signal generation circuits to generate signals. The generated signals can be any suitable signals, such as analog signals, digital signals, and the like. The generated signals can be transmitted out of the IC chip 110. In another example, the IC chip 110 includes signal processing circuits. The IC chip 110 receives external signals, and the signal processing circuits process the received external signals. The external signals can be any suitable signals, such as analog signals, digital signals, and the like.

Further, the IC chip 110 includes input/output (I/O) structures for transmitting signals out of the IC chip 110 and/or receiving signals coming into the IC chip 110. For example, the IC chip 110 includes I/O pads (not shown) that are electrically connected to the circuits on the IC chip 110. Further, solder bumps 112-114 are formed on the I/O pads to assist signal transmission in and out of the IC chip 110. In the FIG. 1 example, the IC chip 110 includes a serializer/deserializer (SERDES) 111 for generating or processing differential signals. In an example, the SERDES 111 is electrically coupled to solder bumps to output differential signals out of the IC chip 110 or receive differential signals coming into the IC chip 110. In the FIG. 1 example, the SERDES 111 is electrically coupled to the solder bump 112 to output or receive one of the differential signals. The coupling elements for outputting and receiving the other signal of the differential signals are omitted in FIG. 1 for clarity purpose.

The package substrate 130 is configured to interface the IC chip 110 with the PCB 120. Specifically, the package substrate 130 includes bump accepting structures, such as lands, and the like, that mate to the solder bumps 112-114 on the IC chip 110. The solder bumps on the IC chip 110 can be aligned with the bump accepting structures on the package substrate 130 to form electrically connected solder bumps 112-114.

Further, the package substrate 130 includes solder balls 151-153 for electrically coupling the IC package 100 to the PCB 120. In an example, the PCB 120 has lands (not shown) that match the solder balls 151-153. The lands are electrically connected to the other devices on the printed circuit board 120. The solder balls 151-153 are aligned with the lands to form electrical connections, in an embodiment.

The package substrate 130 includes coupling elements, such as vias, metal wires, and the like, to couple the electrically connected solder bumps 112-114 to the solder balls 151-153. According to an aspect of the disclosure, the coupling elements are configured to have a specific filtering characteristic, such as a low pass filtering characteristic with a specific cutoff frequency (e.g., 3 dB attenuation frequency), and the like.

The coupling elements, such as I/O pads, solder balls, solder bumps, metal wires, vias, and the like, are made of conductive materials. In addition to the conductive characteristic, the coupling elements also have intrinsic parasitic characteristic, such as capacitive characteristic and the like. The intrinsic parasitic characteristic of the coupling elements may cause non-flat frequency response for signal transferring and may degrade the signal integrity. In an example, capacitive discontinuities in the coupling elements cause a knee behavior in frequency characteristic, such as an insertion loss frequency characteristic, a return loss frequency characteristic, and the like, and also cause a non-flat frequency response before the knee.

According to an aspect of the disclosure, the coupling elements of the package substrate 130 are purposely configured to shape the frequency characteristic according to the electrical signal to transfer. In an example, the SERDES 111 is configured to operate at a Baud rate, such as 5 Gbps (Gigabit per second), and the like, during operation. Then, in an example, the coupling elements of the package substrate 130 are configured to have a low pass filter characteristic with a cutoff frequency determined based on the Baud rate. In an example, the cutoff frequency is determined to be about a half of the Baud rate, such as at 2.5 GHz. Thus, the frequency response is relatively flat for frequencies lower than 2.5 GHz.

In the FIG. 1 example, the package substrate 130 includes coupling elements formed of a signal transmission path to couple the solder bump 112 to the solder ball 152 to transmit an electrical signal between the SERDES 111 and another device on the PCB 120 for example. A portion of the signal transmission path, such as a metal trace 141-143, is purposely configured to shape the frequency characteristic of the signal transmission path to have a low pass filter characteristic with a cutoff frequency about 2.5 GHz in an example.

Specifically, in an example, the package substrate 130 includes multiple metal layers that are separated by insulating layers. The metal layers are patterned of metal traces. Further, the package substrate 130 includes vias to interconnect metal traces in different metal layers to form signal transmission paths. In the FIG. 1 example, the metal trace 141-143 is in a middle metal layer within the package substrate 130. In the example, the metal trace 141-143 is connected to a first via 161 and a second via 171. The first via 161 electrically connects the metal trace 141-143 to a trace in a lower metal layer coupled to the solder ball 152, and the second via 171 electrically connects the metal trace 141-143 to a trace in an upper metal layer. The traces in the lower metal layer and the upper metal layer are not shown for clarity purposes.

Different portions of the metal trace 141-143 are patterned differently to have different impedance characteristic. In the FIG. 1 example, the metal trace 141-143 includes a first portion 141, a second portion 142 and a third portion 143. The first portion 141 has a spiral pattern to form a spiral inductor. The third portion 143 also has a spiral pattern to form a spiral inductor. According to an embodiment of the disclosure, the package substrate 130 has openings 131 and 133 in planes above and below each spiral inductor. The second portion 142 has a finger pattern and is capacitively coupled with another finger pattern 144 to form a finger capacitor. In an example, the finger pattern 144 is configured to be grounded. In an embodiment, the finger pattern 144 is in a plane that is grounded.

It is noted that the inductance values of the first portion 141 and the third portion 143, and the capacitance value of the second portion 142 can be suitably adjusted. In an example, for a spiral pattern, a number, a radius and/or a thickness of loops can be adjusted to adjust the inductance value. In another example, for a finger pattern, a number, length and/or thickness of fingers can be adjusted to adjust the capacitance value.

According to an aspect of the disclosure, the metal trace 141-143 is patterned to dominate the characteristic of the signal transmission path between the bolder bump 122 and the solder ball 152. In an embodiment, the metal trace 141-143 and other coupling elements of the signal transmission path together form a low pass filter. The filter characteristic can be adjusted by suitably adjusting the respective number, respective radius and/or respective thickness of loops for the first portion 141 and the third portion 143 and the number, length and/or thickness of fingers for the second portion 142.

It is noted that the metal trace 141-143 can be formed by any suitable technique. In an example, the package substrate 130 is fabricated using a process similar to a printed circuit board fabrication process. In the example, the metal trace 141-143 is formed using a coating process, a lithographic process and an etching process. Specifically, the coating process applies a copper thin film on a board surface. In the lithographic process, a photoresist layer is applied on the copper thin film. The photoresist layer is exposed according to a mask that defines the desired copper patterns, such as the spiral patterns for the portions 141 and 143, and the finger patterns for the portions 142. Then, the photoresist layer is developed to remove the portions of the photoresist at the undesired portions to expose the undesired copper portions. Further, the etching process etches away the undesired copper portions and leaves the desired portions protected by the photoresist. Finally, the remaining photoresist is stripped away.

It is noted that the inductors and the capacitors can be formed by other suitable pattern and technique. In an example, the capacitor is formed by two spiral patterns arranged alternatively. In another example, an inductor is formed by square shaped loops instead of circle shaped loops. In another example, the inductors and the capacitors can be formed by traces in different metal layers. Also, the metal trace 141-143 can be patterned to form any number of inductors, and any number of capacitors.

It is also noted that while FIG. 1 shows three dielectric or isolation layers in the package substrate 130, the package substrate 130 can include any suitable number of dielectric layers.

It is also noted that FIG. 1 only shows the coupling elements for one of the differential signals, the coupling elements for the other signal of the differential signals can be similarly configured and are omitted for clarity purpose. Further, it is noted that, for ease of illustration, the elements in FIG. 1 are not drawn to their scales.

Figure 2:
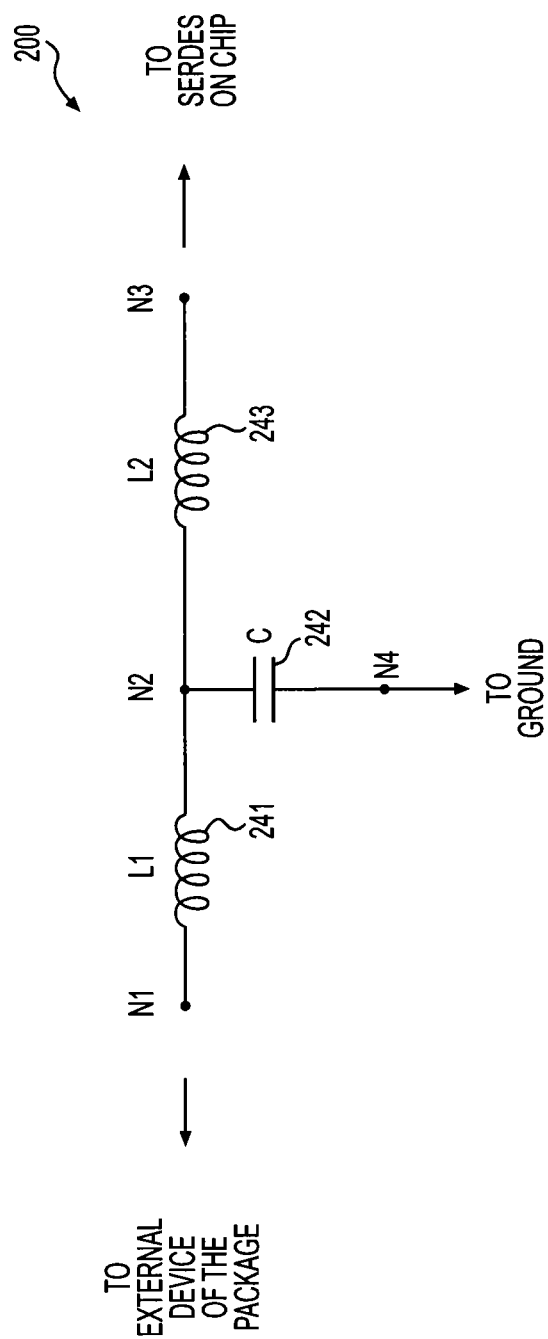
FIG. 2 shows a schematic diagram of a circuit 200 according to an embodiment of the disclosure.

FIG. 2 shows a schematic diagram of a circuit 200 for the metal trace 141-143 in FIG. 1 according to an embodiment of the disclosure. The circuit 200 includes a first inductor L1 corresponding to the spiral inductor formed by the first portion 141, a second inductor L2 corresponding to the spiral inductor formed by the third portion 143, and a capacitor C corresponding to the finger capacitor formed by the second portion 142 and the portion 144.

The first inductor L1 is coupled between nodes N1 and N2, the second inductor L2 is coupled between nodes N2 and N3, and the capacitor C is coupled between nodes N2 and N4. The node N1 is coupled to the external device the package 100 via other suitable coupling elements, and the node N3 is coupled to the SERDES 111 on the IC chip 110 via other suitable coupling elements. The node N4 is suitably grounded.

According to an embodiment of the disclosure, the circuit 200 dominates the characteristic of the signal transmission path between the solder bump 112 and the solder ball 152. The capacitive or inductive characteristic of other portions of the signal transmission path can be ignored or lumped into the inductors L1 and L2 and the capacitor C.

The circuit 200 has a low pass filter characteristic, and the filter characteristic depends on inductance values of the inductors L1 and L2 and a capacitance value of the capacitor C. In an example, the inductance values and the capacitance value are tunable by adjusting the number of loops for the spiral inductors, and number of fingers for the finger capacitor. In an embodiment, the number of loops for the spiral inductors and the number of fingers for the finger capacitor are adjusted such that circuit 200 has a specific cutoff frequency.

In an example, the specific cutoff frequency is determined based on a rate of an electrical signal transmitted by the signal transmission path. In an example, the cutoff frequency is about a half of the Baud rate of the SERDES 111.

Figure 3:
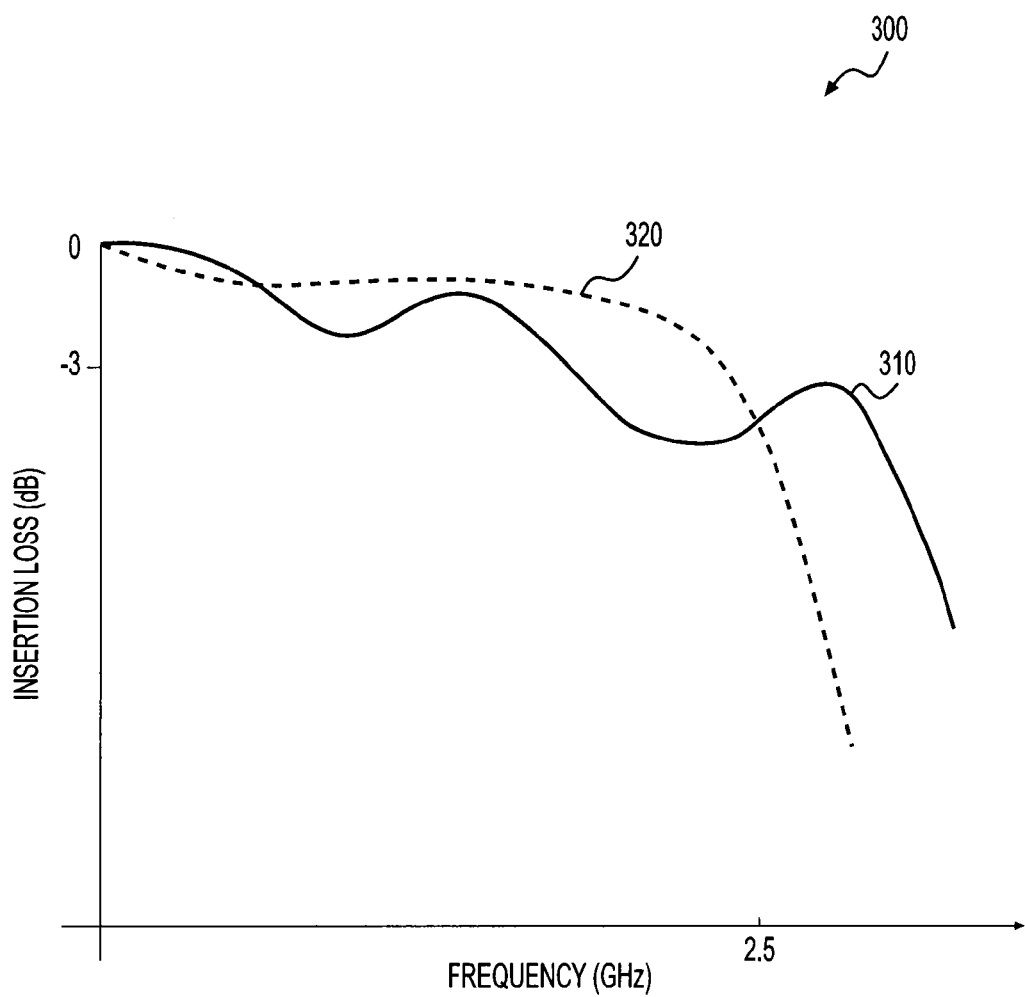
FIG. 3 shows a plot of insertion loss frequency characteristic according to an embodiment of the disclosure.

FIG. 3 shows a plot 300 of insertion loss frequency response according to an embodiment of the disclosure. The X axis of the plot 300 corresponds to frequency, and the Y axis of the plot 300 corresponds to the insertion loss in dB. The plot 300 includes a first curve 310 corresponding to an insertion loss frequency characteristic of a comparison example, and a second curve 320 corresponding to an insertion loss frequency characteristic of the signal transmission path that includes the metal trace 141-143 in FIG. 1.

In the comparison example, metal traces are formed as generally straight lines and do not dominate the frequency characteristic for signal transmission. Other coupling elements, such as solder bumps, solder balls and the like, dominate the frequency characteristic. Due to capacitive discontinuities in such other coupling elements, the insertion loss frequency characteristic 310 shows a knee behavior, and a non-flat frequency response before the knee.

In the FIG. 1 example, the metal trace 141-143 is patterned to dominate the frequency characteristic and have a low pass filter characteristic. Thus, the insertion loss frequency characteristic 320 shows a knee with a lower knee frequency than the insertion loss frequency characteristic 310, but a much more flat frequency response before the knee. Thus, in an example, when the cutoff frequency (e.g., a frequency corresponding to −3 dB) of the insertion loss frequency characteristic 320 is about a half of the Baud rate of the SERDES 111, the insertion loss frequency characteristic 320 provides a better signal integrity than the insertion frequency characteristic 310 for the SERDES 111.

Figure 4:
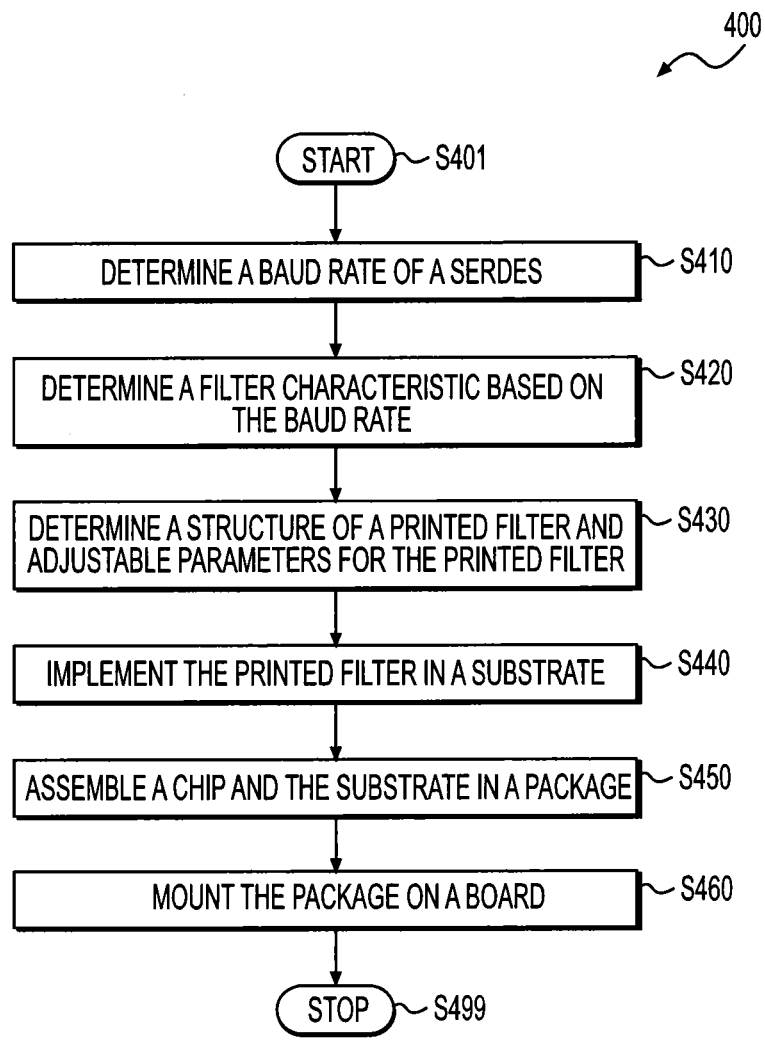
FIG. 4 shows a flowchart outlining a process example for implementing a printed filter in a system according to an embodiment of the disclosure.

FIG. 4 shows a flowchart outlining a process example for implementing a printed filter in a system according to an embodiment of the disclosure. The process starts at S401 and proceeds to S410.

At S410, a Baud rate of the SERDES 111 is determined. In an example, a system specification can specify the Baud rate used in the system for signal transmission between the IC chip 110 and other devices in the system.

At S420, a filter characteristic is determined based on the Baud rate. In an example, the printed filter is a low pass filter. A cutoff frequency of the low pass filter is determined to be about a half of the Baud rate in an embodiment. It is noted that other cutoff frequency can be determined based on the Baud rate as a matter of design choice.

At S430, a filter architecture is determined with adjustable parameters. Generally, a printed filter can be implemented using various architectures. In an example, a low pass filter can be implemented using a resistor and a capacitor or using an inductor and a capacitor or using the architecture of the circuit 200. The filter architecture can be determined based on various factors, such as a complexity of implementation, area consumption, the number of adjustable parameters, a desired filtering characteristic, a timing requirement, and the like.

At S440, the filter is implemented in a package substrate. In the example, the filter is formed using a process for printed circuit board fabrication, such as using a coating process, a lithographic process and an etching process. Specifically, the coating process applies a copper thin film on a board surface. In the lithographic process, a photoresist layer is applied on the copper thin film. The photoresist layer is exposed though a mask that defines the desired copper patterns, such as the spiral patterns for the portions 141 and 143, and the finger patterns for the portions 142. Then, the photoresist layer is developed to remove the portions of the photoresist at the undesired portions to expose the undesired copper portions. Further, the etching process etches away the undesired copper portions and leaves the desired portions protected by the photoresist. Finally, the remaining photoresist is stripped away.

At S450, the chip 110 and the package substrate 130 are assembled together into the IC package 100. The chip 110 and the package substrate 130 can be assembled together using any suitable assembling technique.

At S460, the IC package 100 and other devices are mounted onto the PCB 120. The process then proceeds to S499 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit package comprising:
   a first signal terminal electrically coupled with a serializer/deserializer (SERDES);
   a second signal terminal electrically coupled with an external electronic component; and a trace disposed on an insulating layer, the trace configured to transfer an electrical signal between the first signal terminal and the second signal terminal, and being patterned to have a low pass filter characteristic of a cutoff frequency that is about a half of a Baud rate of the SERDES.

2. The circuit package of claim 1, wherein the trace includes an inductive portion patterned to have an inductive characteristic.

3. The circuit package of claim 2, wherein the inductive portion is patterned to form a spiral inductor.

4. The circuit package of claim 1, wherein the trace includes a capacitive portion patterned to have a capacitive characteristic.

5. The circuit package of claim 4, wherein the capacitive portion is patterned to form a finger capacitor.

6. The circuit package of claim 1, further comprising:
an integrated circuit (IC) chip mounted in the circuit package with the SERDES disposed on the IC chip.

7. A method comprising:
receiving an electrical signal for transmission between a serializer/deserializer (SERDES) on an IC chip and an external electronic component;
transferring the electrical signal between a first signal terminal and a second signal terminal over a trace disposed on an insulating layer, the first signal terminal being electrically coupled with the serializer/deserializer (SERDES) and the second signal terminal being electrically coupled with the external electronic component; and
filtering the electrical signal by the trace that is patterned to have a low pass filter characteristic of a cutoff frequency that is about a half of a Baud rate of the SERDES.

8. The method of claim 7, wherein filtering the electrical signal by the trace that is patterned to provide the specific filtering characteristic to filter the electrical signal further comprises:
filtering the electrical signal by the trace that includes an inductive portion patterned to have an inductive characteristic.

9. The method of claim 8, wherein filtering the electrical signal by the trace that includes an inductive portion patterned to have an inductive characteristic further comprises:
filtering the electrical signal by the trace that the inductive portion is patterned to form a spiral inductor.

10. The method of claim 7, wherein filtering the electrical signal by the trace that is patterned to provide the specific filtering characteristic to filter the electrical signal further comprises:
filtering the electrical signal by the trace that includes a capacitive portion patterned to have a capacitive characteristic.

11. The method of claim 10, wherein filtering the electrical signal by the trace that includes the capacitive portion patterned to have the capacitive characteristic further comprises:
filtering the electrical signal by the trace that the capacitive portion is patterned to form a finger capacitor.

12. A package substrate, comprising:
a trace disposed on an insulating layer, the trace being configured to transfer an electrical signal between a first coupling element coupled to an serializer/deserializer (SERDES) and a second coupling element coupled to another device, and being patterned to have a low pass filter characteristic of a specific cutoff frequency that is about a half of a Baud rate of the SERDES.

13. The package substrate of claim 12, wherein the trace includes an inductive portion patterned to have an inductive characteristic.

14. The package substrate of claim 12, wherein the trace includes a capacitive portion patterned to have a capacitive characteristic.

15. A method for manufacturing a package substrate comprising:
providing a dielectric substrate; and
forming one or more traces on the dielectric substrate with a pattern configured to provide a specific filtering characteristic to filter an electrical signal transmitted through the traces wherein the trace is patterned to have a low pass filter characteristic of a specific cutoff frequency that is about a half of a Baud rate of a serializer/deserializer (SERDES) coupled to the traces.

* * * * *